(12) United States Patent
Diamant et al.

(10) Patent No.: US 7,545,179 B2
(45) Date of Patent: Jun. 9, 2009

(54) ELECTRONIC DEVICE AND METHOD AND PERFORMING LOGIC FUNCTIONS

(75) Inventors: Gilad Diamant, Haifa (IL); Dmitry Shvarts, Kiryat Ono (IL); Erez Halahmi, Bazra (IL); Ron Naaman, Rehovot (IL); Leeor Kronik, Rehovot (IL)

(73) Assignee: NovaTrans Group SA, Vaumarcus NE (CH)

( * ) Notice: Subject to any disclaimer, the term of this patent is extended or adjusted under 35 U.S.C. 154(b) by 0 days.

(21) Appl. No.: 11/814,544

(22) PCT Filed: Jan. 22, 2006

(86) PCT No.: PCT/IL2006/000091

§ 371 (c)(1),
(2), (4) Date: Jul. 23, 2007

(87) PCT Pub. No.: WO2006/077596

PCT Pub. Date: Jul. 27, 2006

(65) Prior Publication Data

US 2008/0136455 A1      Jun. 12, 2008

Related U.S. Application Data

(60) Provisional application No. 60/645,029, filed on Jan. 21, 2005.

(51) Int. Cl.
*H03K 19/00*    (2006.01)
*H01J 1/02*     (2006.01)
*H01J 1/34*     (2006.01)

(52) U.S. Cl. .................. 326/111; 313/336; 313/351

(58) Field of Classification Search ................ 326/111; 313/336, 495, 309, 351
See application file for complete search history.

(56) References Cited

U.S. PATENT DOCUMENTS

| 4,663,559 | A |   | 5/1987  | Christensen          |
|-----------|---|---|---------|----------------------|
| 5,012,153 | A |   | 4/1991  | Atkinson et al.      |
| 5,155,420 | A |   | 10/1992 | Smith                |
| 5,218,273 | A |   | 6/1993  | Kane et al.          |
| 5,574,438 | A | * | 11/1996 | Kan et al. .............. 340/825.97 |
| 5,869,842 | A |   | 2/1999  | Kang et al.          |
| 6,437,360 | B1|   | 8/2002  | Cho et al.           |
| 6,518,590 | B1|   | 2/2003  | Hinton et al.        |

FOREIGN PATENT DOCUMENTS

EP           0495436 A2    1/1992

* cited by examiner

*Primary Examiner*—Daniel D Chang
(74) *Attorney, Agent, or Firm*—Browdy and Neimark, P.L.L.C.

(57) ABSTRACT

An electronic device is presented which is configured to operate as at least one logic gate. The device comprises an electrodes arrangement of one or more basic units, the basic unit being configured to define at least one vacuum space for free charged particles' propagation and comprising an input assembly for supplying an input signal, and a floating electrode assembly accommodated proximal said input assembly and serving for reading an output signal therefrom, the floating electrode arrangement being configured to define at least one source of the free charged particles and at least one target toward which the charged particles are directed and is chargeable and dischargeable in response to the input signal thereby creating the output of the basic unit.

50 Claims, 11 Drawing Sheets

ELECTRONIC DEVICE AND METHOD AND PERFORMING LOGIC FUNCTIONS

FIELD OF THE INVENTION

This invention relates to electronic devices performing various logic functions.

BACKGROUND OF THE INVENTION

Various techniques have been developed aimed at implementing logic functions (or logic gates) in hardware. There are several different families of logic gates, including, inter alia, diode logic gates, resistor-transistor logic gates, diode-transistor logic gates, transistor-transistor logic gate, and CMOS (Complementary Metal-Oxide-Semiconductor) based logics.

For example, U.S. Pat. No. 5,012,153 discloses a split collector vacuum field effect transistor. This device is designed to perform higher level functions such as logic AND, EXCLUSIVE OR (NOR), demultiplexing, or frequency multiplication with a single device. These higher level functions are accomplished by dividing the collector of the vacuum FET into multiple segments and by providing steering electrodes just above the emitter to deflect the field emission current to the various collector segments. The collector pattern, together with the configuration of the applied signals to the device, determines the higher order function performed.

U.S. Pat. No. 5,155,420 discloses switching circuits employing field emission devices. A differential amplifier current steering circuit is described wherein the active circuit elements are realized as field emission devices (FEDs) which provide for an extended range of operation to include modulation/demodulation applications up to the order of one Terahertz and digital logic function applications up to the order of one hundred gigabits per second. In a particular embodiment of the FED, switching circuit vertical integration of selectively interconnected FEDs is employed to provide the desired switching circuit function.

SUMMARY OF THE INVENTION

There is a need in the art to facilitate hardware-based implementation of various logic functions, by providing a novel electronic device capable of performing different logic gates (functions) using free electrons (generally, charged particles) moving in vacuum.

The main idea of the present invention consists of creating the device output by charging/discharging one or more floating electrodes in response to a certain input field. The output is read as electric potential(s) on the charged/discharged electrode(s). This electric potential at the floating electrode is defined by the so created charge (depending on the self capacitance of the floating electrode and/or the inter-electrode capacitance) and a potential induced by one or more other electrodes (floating or not).

The input field may be an input voltage at one or more active electrodes (electrically connected to a controllable power supply or grounded), or may be the output voltage at the floating electrode of a preceding device in an array of such devices. In other words, in some embodiments of the invention, an input signal may be applied to an active or floating electrode.

It should be understood that the term "floating electrode" refers to an electrode which, contrary to an active electrode, is not connected to any voltage supply unit (e.g. an electrical power supply), but rather has a floating potential. It should also be noted that the present invention deals with any charged particles (negative or positive), and is exemplified below with respect to electrons constituting such charged particles.

The present invention provides for creating the device output in the form of any logic function (e.g., AND, XOR, etc.) of inputs (Boolean values). Also, the invention provides for the device operation as a resonator (controlling the radiation generation depending on the electrons' trajectory through the device).

A device of the present invention includes an electrodes arrangement defining at least one basic unit. The latter has a floating electrode assembly defining at least one source of free charged particles (e.g. electrons) to propagate in vacuum and at least one target toward which the electrons can be directed, and having an input signal assembly (e.g. at least one input electrode). The basic unit thus includes the source and/or target floating electrode(s), which can be charged or discharged and from which the output can be read. The input electrode is an active electrode in case of the single-unit device or the first unit of a multiple-unit device; or may be a floating electrode in an intermediate or last unit of the multiple-unit device.

It should be understood that the term "basic unit" signifies a structure which is formed by an arrangement or electrodes (e.g., two- or multiple-electrode arrangement, such as a triode) and the output of which can be read from any one of its floating electrodes.

The device of the present invention (namely, its electrode arrangement) defines one or more spaces (the so-called "cavities") for propagation of electrons between the electrodes. The basic unit may for example be configured to define the single "cavity", and may be operable to perform one or more logic gates (functions).

The basic unit may include one or more floating electrode assemblies (or sets). In each set, all source/target electrodes are at the same potential, which may be different from the potential of other set(s).

This can be implemented by electrically connecting the electrodes associated with the same set to one another, or by using a single suitably shaped (e.g. curved) electrode with predefined source and target regions.

In some embodiments, the source and target (of the same floating set) may be constituted by the same electrode region. In this case, electrons are emitted from and return to the same electrode region (rather than spaced-apart regions), given an appropriate external field. More specifically, electrons are driven away from the floating source (Cathode) that emits said electrons, thus discharging the source, and are then caused to return to the same source operating also as the floating target. In this configuration, the input field may be created either by an electric potential applied to an active/floating input electrode, and/or by an external field causing electron emission from the Cathode (e.g. photoemission).

In an embodiment utilizing more than a single floating electrode set, where each set includes at least one source and at least one target, charge may be transferred between sets when electrons emitted from a source of one set reach the target of another set. This process depends on the input potential (if any) and on the potential difference between the sets, which in turn depends on the inter-set capacitance and on the distribution of charge between the sets. In general, the process of charge transfer stops when the potential difference between the participating sets (i.e., the source's set and the target's set) can no longer be traversed by the emitted electrons (i.e., when it becomes equal to, for example, the maximal kinetic energy of the emitted electrons).

In the description below, the source and target are referred to as Cathode and Anode. It should however be understood that this definition is associated solely with functional features, namely Cathode operates to emit electrodes and Anode presents a target for the emitted electrons. Also, for the purposes of the description of the invention, an electrode to which input voltage is applied is referred to as a Gate electrode. As indicated above, such a Gate electrode may be an active electrode or may be constituted by the output floating electrode (e.g. Anode) of the preceding basic unit in an array of such units.

Preferably, the source electrode is configured and operable to generate electrons with non-zero initial kinetic energy, which can be achieved using a Photocathode, or by associating the Cathode with any other external, emission-inducing field (e.g. temperature, electric field, etc.).

Generally speaking, the electrodes' arrangement of the basic unit is configured to define a vacuum space (cavity), or more than one cavity, for propagation of free electrons (charged particles), emitted from the floating source and driven by the input field (e.g. electric potential on the active or floating Gate) away from the source and towards the target. The device output may be read from any one of the floating electrodes.

The device of the present invention thus operates by transporting charge to or from at least one floating electrode, according to at least one input field (input voltage applied to at least one active electrode, the so-called "control Gate electrode", or induced at one of floating electrodes thus serving as the input electrode), the output being the resultant potential of one or more floating electrodes. The output may be any logical function (e.g. AND, OR, etc.) of the inputs, and is determined by the configuration of the electrodes' arrangement.

The method of the present invention for transferring charge from and to the source and target (e.g. between them) utilizes emission of electrons (preferably photoemission) from at least one floating source, so that the emitted electrons propagate in the device cavity(ies) and are collected by one or more floating targets. The electrons' trajectories are affected by an electric field that depends on the input field (input voltage). Thus, the input field (voltage) affects certain parameters, such as the electrons' time of flight and the electrode(s) at which they are collected, these parameters being used to effect the desired logical function. Other methods of controlled charge transfer, such as conducting means with switching functionality suitably dependent on the input voltage, can also be used.

Thus, in one example of the present invention, the basic unit includes at least a Gate electrode (constituting an input electrode) and a floating Cathode electrode.

According to some other examples, the basic unit includes Gate electrode(s) and separate floating Cathode(s) and Anode(s).

Considering the use of a Photocathode, the device is associated with an illumination source. The latter includes a light emitting assembly and possibly also a light guiding assembly effecting access of illumination to the Photocathode. The Photocathode may be directly exposed to illumination, and/or via light reflection, e.g., from other electrode(s). It should be understood that the light emitting assembly may or may not be a constructional part of the device. For example, the Photocathode may be exposed to ambient light, or the light guiding assembly including optical fiber(s), and/or an optical window may be used to enable light access (direct or indirect) from an external light emitting assembly to the Photocathode.

For example, a Photocathode may be located on at least partially transparent substrate (being a single- or multi-layer structure) presenting an optical window for the light access to the Photocathode.

As indicated above, the floating electrode assembly may be in the form of a set of floating electrodes including at least one Cathode and at least one Anode, thereby presenting a source of electrons and a target toward which they may reach. The device may include two or more such sets of floating electrodes, the electrodes of each set having the same potential (being electrically connected together); and one or more input electrodes (Gate electrodes). The Gate electrode(s) may be common for at least two sets of floating electrodes. The Gate(s) may be selectively supplied with predefined voltages, such as those defined as LOW and HIGH (which correspond to the two Boolean values).

Preferably, additional "side" electrodes are used, being accommodated aside the electrons' propagation cavity and maintained during the device operation at either HIGH or LOW reference voltage. As will be exemplified below, the same device configuration may provide for effecting different logic gates depending on whether HIGH or LOW voltage is maintained at the side electrodes.

It should be understood that the terms "HIGH potential" and "LOW potential" refer to any two distinct potential values or ranges, that logically correspond to the two Boolean values '0' and '1'. For example, in some embodiments disclosed herein, the "HIGH potential" is equal to the maximal kinetic energy of the emitted electrons (e.g., 0.2V), and the "LOW potential" is zero. However, this is essentially equivalent to a definition of the "LOW potential" as minus the maximal kinetic energy of emission (e.g., $(-0.2)V$), and of the "HIGH potential" as zero. In general, an arbitrary potential may be added to both "HIGH" and "LOW" potentials without affecting the behavior. This is because the potential differences are of interest, not the potentials' absolute values.

Comparing the technique of the present invention to the known techniques of the kind specified, the following should be noted. According to the known techniques, a logic function is usually implemented using several electrically connected conventional transistor/diode structures, whereas according to the present invention, a logic function can be implemented using a single basic unit. The device of the present invention is thus configured to implement a logic function using at least one basic unit capable of implementing logic functions of one, two or more input fields (signals). For example, with the conventional CMOS based logics NAND logic function implementation typically requires four transistor units. Thus, the present invention provides for a much higher chip density and significant reduction of the required interconnects. In addition, the device of the present invention is capable of providing much higher switching speed, and low heat dissipation, as compared to those of the conventional CMOS-based device. For example, the size of the single logic gate device of the present invention can be of about ⅕ of the CMOS-based logical circuit.

Moreover, the device according to the invention can be configured such that the logic function it implements is set by an additional input, e.g. a logical "1" corresponding to the device performing the NAND function, and a logical "0" corresponding to the device performing the NOR function. Similarly, using ferromagnetic electrodes creates a "spintronic" device, the operation of which can also be controlled by applying an external magnetic field, thus changing the device functionality in real-time.

According to the invention, any type of electrons' source could be used, provided the energetic and directional properties of electrons can be defined. More specifically, photoemission, thermo-emission and field emission can be used for the electrons' extraction. The device of the present invention, in its various configurations, as exemplified herein, can be easily adapted to standard semiconductor manufacturing technologies.

Using photoemission is especially attractive, since photoemission devices are on the one hand operable with relatively low voltages as compared to those required for field emission devices, and on the other hand do not dissipate as much heat as thermo-emission devices. Moreover, miniaturization of photoemission devices is straightforward, and this, along with the motion of electrons in vacuum, allows for high speed of operation.

Thus, according to one broad aspect of the present invention, there is provided an electronic device comprising an electrodes arrangement of one or more basic units, the basic unit being configured to define at least one space for free charged particles' propagation in vacuum and comprising an input assembly for supplying an input signal, and a floating electrode assembly accommodated proximal said input assembly and serving for reading the device output therefrom, the floating electrode arrangement being configured to define at least one source of the free charged particles and at least one target toward which the charged particles are directed and is chargeable and dischargeable in response to the input signal thereby creating an output of the basic unit.

In some embodiments of the invention, the input assembly includes one or more input electrodes, which may be active or floating.

According to another broad aspect of the invention, there is provided a method for use in implementing various logic functions, the methods comprising controllably applying an input field to a floating electrode assembly to thereby affect free charged particles' propagation in vacuum from the floating source of charged particles to the floating target, and controlling the read out of an electric potential on a selective one of the floating electrodes, the selectively read output being indicative of the selected logic function.

According to yet another broad aspect of the invention, there is provided a method for use in implementing various logic functions, the method comprising: providing an electrodes arrangement formed by an input electrode assembly and a floating electrode assembly defining at least one floating source of free charged particles propagating through vacuum and at least one floating target toward which the electrons can propagate; controlling an electrical input signal to at least one active electrode of the input electrode assembly thereby causing charging or discharging the at least one floating electrode in response to the input signal; and selectively reading a potential on at least one of the floating electrodes, the selectively read output being indicative of the selected logic function.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE INVENTION

The present invention provides an electronic device utilizing one or more floating electrodes for effecting and reading the device output in accordance with the input field (electrical input at one or more input electrodes). This output may be indicative of a certain logic function, or a resonance condition of the device.

The following are schematic illustration of examples of devices of the present invention. It should be understood that the device configurations are shown here schematically (not in scale) in order to facilitate understanding.

Figure 1A:
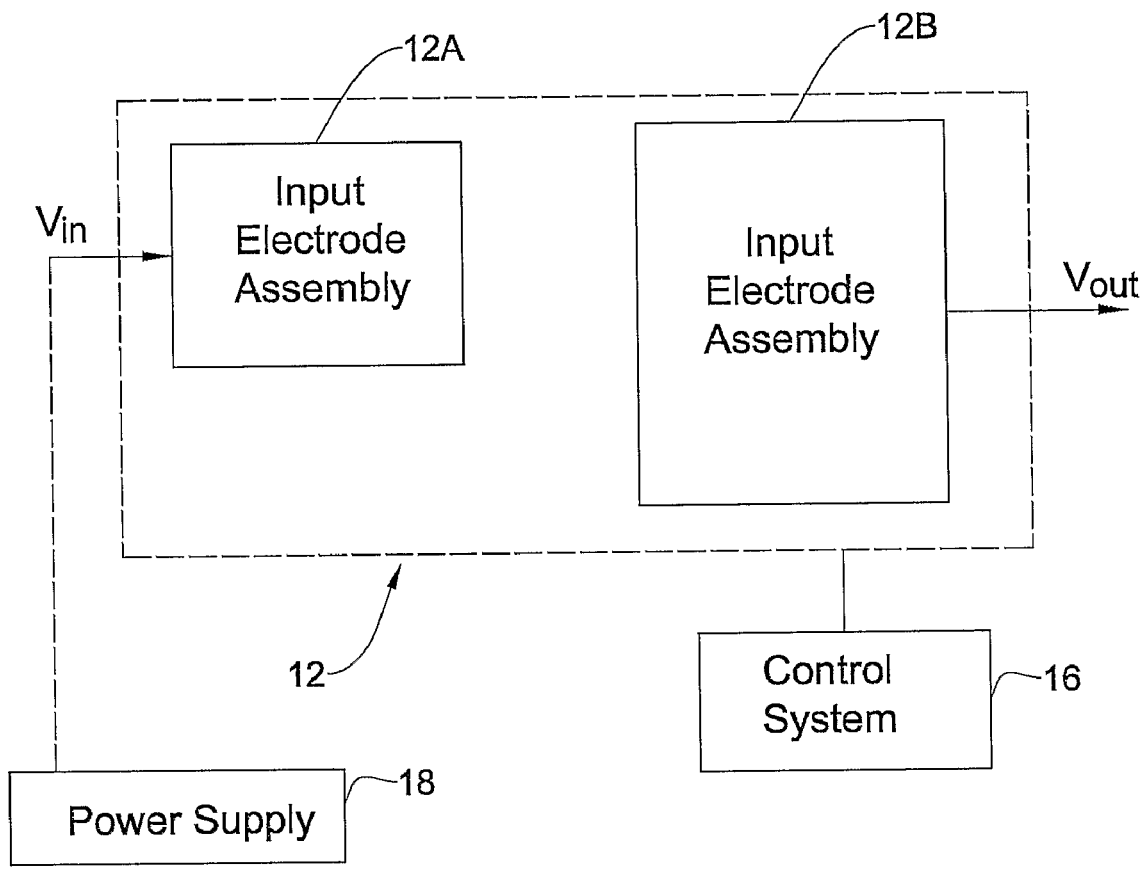
FIG. 1A is a schematic illustration of a basic unit suitable to be used in the device of the present invention.

FIG. 1A illustrates, by way of a block diagram, an example of an electronic device 10 utilizing the principles of the invention. Device 10 presents a basic unit for use in various electronic devices, formed by one or more such basic units in electrical communication with one another (as will be exemplified further below with reference to FIG. 9).

Device 10 includes an electrodes arrangement 12 including an input electrode assembly 12A formed by one or more input electrodes (active or floating) for supplying an input voltage signal, $V_{in}$, thereto (e.g., from a power supply unit 18 is an example of the active input electrode); and a floating electrode assembly 12B accommodated proximal the input electrode(s) and serving for charge transfer and for reading the so-effected device output $V_{out}$ therefrom.

Floating electrode assembly 12B is configured to define at least one source of free electrons (constituting charged particles) and at least one target toward which the electrons can be directed, defining at least one space (cavity) 14 for the free electrons propagation in vacuum. At least one floating electrode or set of floating electrodes in assembly 12B is chargeable and/or dischargeable in response to input voltage, $V_{in}$, on electrode(s) 12A. The charged (or discharged) state of said at least one floating electrode presents the device output and is read as an electric potential on the floating electrode. This output electric potential is determined by the excess charge on the floating electrode, by the inter-electrode capacitance and by the potential induced by other electrodes (floating or not).

Device 10 is associated with a control system 16 including various utilities enabling either one of the following: controlling the input signals and reading the output signals. The input signal may be that coming from another device or another basic unit of the same device; the input electrode may thus be floating or not. It should thus be understood that the control system may be at least partially constituted by other (e.g., similar) electronic device(s).

Figure 1B:
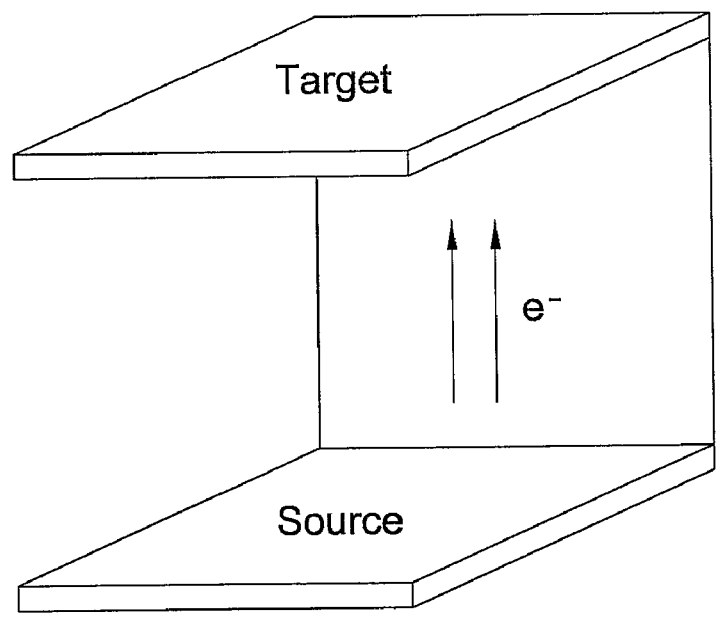
FIG. 1B shows an example of the floating assembly configuration, where the same Cathode electrode serves as a source of free electrons and a target towards which the electrons are directed.

Basic unit 10 may include one or more input electrodes (or control Gates) which may be active or floating. Floating electrode assembly may include source and target electrodes in the form of separate electrodes at the same electric potential, or the same source-electrode (Cathode) may serve as both the source and target electrode as exemplified in FIG. 1B.

One of the basic elements for configuring various logic gate devices is a NOT gate element (inverter). The NOT gate configuration according to the present invention is based on the transport of charge to or from at least one floating electrode according to input voltage applied to at least one control gate electrode, in such a way that when the input voltage is HIGH (corresponding to one of the Boolean values, e.g. '0' or '1'), the output voltage becomes LOW (corresponding to the other Boolean value), and vice versa. The present invention provides for various configurations of an inverter utilizing one or more basic units configured as described above.

FIGS. 2A-2C, 3, 4, and 5A-5C exemplify NOT gate element (inverter) configurations according to the invention. In these examples, electronic devices are configured to implement electrons movement between two sets of electrically floating electrodes, generally at 12B, according to input voltage applied to one or more control Gate electrodes, generally at 12A. The floating electrodes of each set are at the same potential (e.g. are interconnected), and, in general, the sets are at different electric potentials. An output voltage is read from one of the two sets of floating electrodes. As will be described more specifically further below, reading the output from different floating electrodes may provide for different logic functions in the same device configuration.

When the input voltage to the Gate electrode is HIGH, negative charge is transferred from one set of floating electrodes to the other. The output voltage is read from the second set, which, due to the charge transfer, becomes negatively charged, and therefore the read output voltage is LOW. When the input voltage is LOW, negative charge is transferred back to the first set of floating electrodes, and as a result the output voltage becomes HIGH.

Figure 2A:
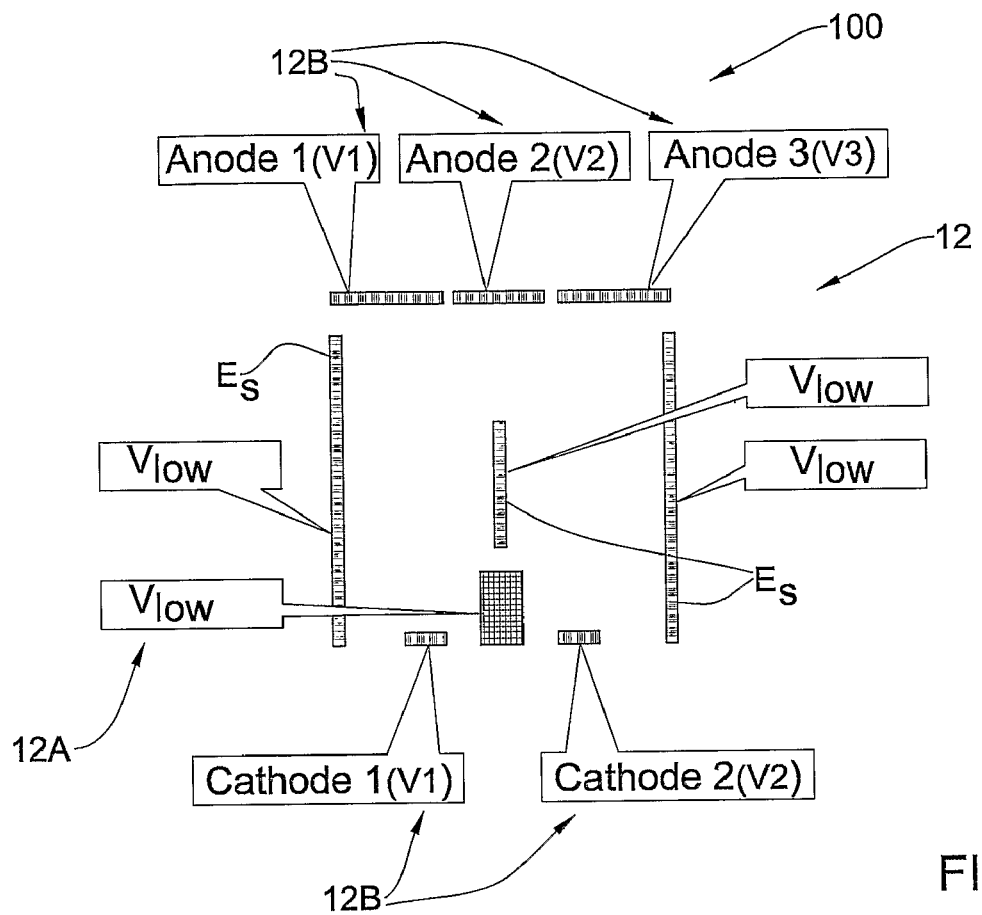
FIGS. 2A to 2E schematically illustrate various examples of the construction and operation of the device of the present invention configured to be operable as an inverter (NOT gate)

In a device 100 depicted in FIG. 2A, floating electrode arrangement 12B includes a first set of floating electrodes, all at the same potential $V_1$, including a single Cathode $C_1$, and Anodes $A_1$ and $A_3$; and a second set of floating electrodes, all at the same potential $V_2$, including a single Cathode $C_2$ and a single Anode $A_2$. Cathodes $C_1$ and $C_2$ are electron emitters (source-electrodes), preferably illuminated Photocathodes. In the present example, output voltage, $V_{out}$, is read at the second set (e.g. at Anode $A_2$); hence $V_{out}=V_2$. Also preferably provided in device 100 are side electrodes $E_S$, which are kept at LOW voltage, $V_{low}$, and serve for stabilizing the electrostatic properties of the device (e.g. focusing the emitted electrons to the Anodes, and shielding the initial part of the electron trajectories from the Anode voltages). The floating electrodes sets are appropriately arranged to define electrons movement paths from Cathode(s) to Anode(s) of the same set, and from Cathode(s) of one set to Anode(s) of the other set.

Electrons emitted from the Cathodes have some distribution of initial kinetic energy (e.g. due to the use of illuminated Photocathodes). The maximal kinetic energy of emission $E_k$ (in electron-volts) defines the HIGH voltage $V^{(high)}$.

For example, if the maximal kinetic energy $E_k$ of the emitted electrons is 0.2 eV, then $V^{(high)}$ is equal to 0.2V.

Figure 2B:
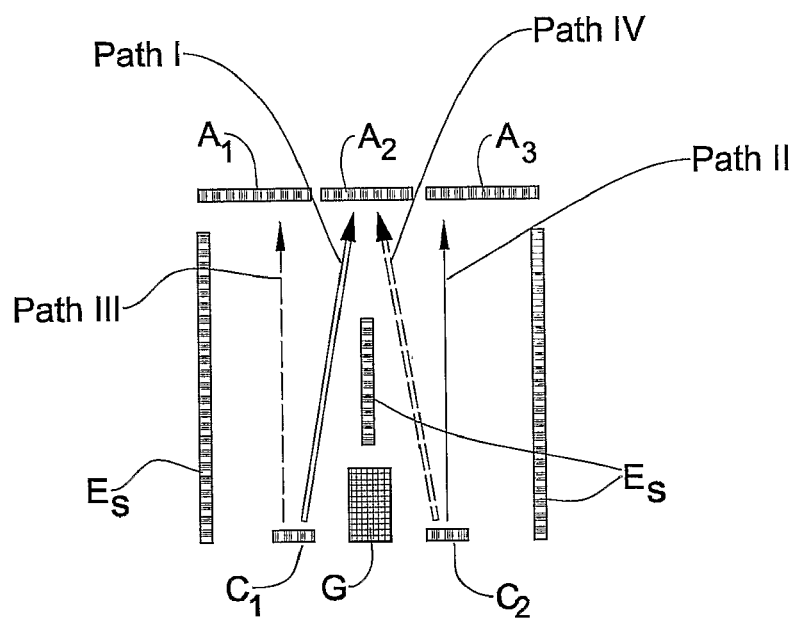

The operation of inverter device 100 will now be described with reference to FIG. 2B showing schematically the electrons' paths during the device operation.

Path I corresponds to the electrons' transfer from the first floating electrode set to the second floating electrode; this is actually electrons' transfer from cathode $C_1$ to anode $A_2$. Path II corresponds to the electrons' transfer from the second set back to the first set (i.e. electrons' transfer from cathode $C_2$ to anode $A_3$). Path III corresponds to the electrons' initial "circulation" within the first set (i.e. electrons' movement from cathode $C_1$ to anode $A_1$). Path IV corresponds to the electrons' circulation within the second set (i.e. electrons' movement from cathode $C_2$ to anode $A_2$).

When control gate G (constituting input unit 12A) is set to potential $V^{high}$, electrons take paths I and IV, and are therefore transferred from the first floating electrode set to the second one (from cathode $C_1$ to anode $A_2$), thus raising the potential of the first set relative to the second. The process ceases once the potential difference $(V_1-V_2)$ which is equal to the maximum kinetic energy of the electrons $E_k$, whereupon the potential of Anode $A_2$ is sufficiently negative relative to that of cathode $C_1$ to prevent electrons from reaching the former along path I. The output voltage is read from one of the anodes, yielding $V^{high}$ if read from Anode $A_2$ and $V^{low}$ if read from Anodes $A_1$ or $A_3$.

When Gate G is set to potential $V^{low}$, electrons take paths II and III, and are therefore transferred from the second floating electrode set back to the first set (from cathode $C_2$ to anode $A_3$), thus raising the potential of the second set relative to the first set. The process ceases once anode $A_3$ is negative enough to repel the electrons which propagate towards it along path II; this occurs when $(V_2-V_1)$ equals the maximum kinetic energy of the electrons $E_k$, as emitted from the Cathodes.

Figure 2C:
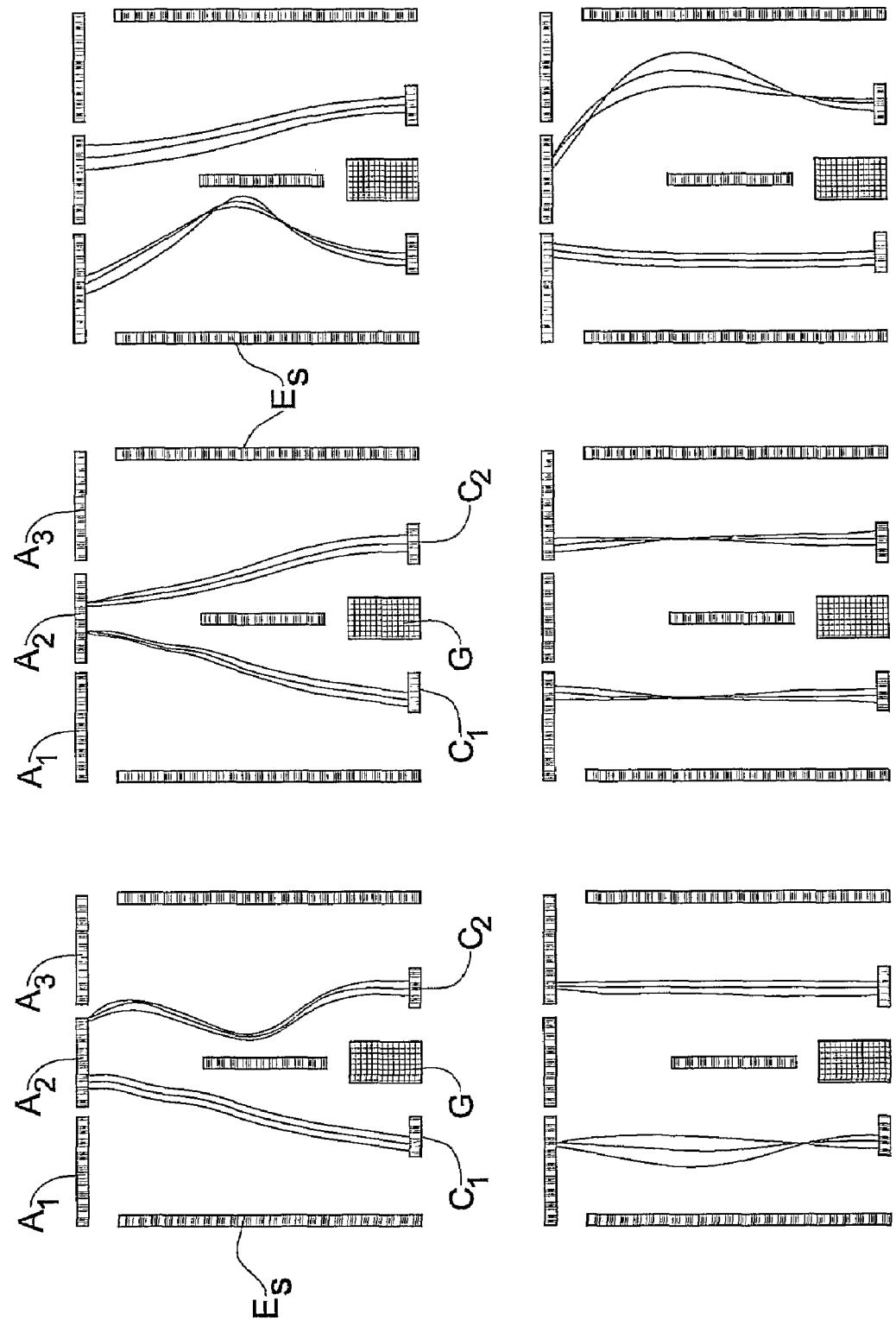

FIG. 2C shows detailed simulation, including intermediate stages, of the operation of inverter device 100. In this example, the maximal kinetic energy of electrons is $E_k=0.2$ eV, the Gate voltage (which is the input voltage $V_{Gate}=V_{in}$) is either $V^{high}=0.2V$ (corresponding to Boolean value "1") or $V^{low}=0V$ (corresponding to Boolean value "0"); voltage $V_1$ and voltage $V_2$ (which is the output voltage $V_{out}$) take on values ranging between $V^{low}=0V$ and $V^{high}=0.2V$. The electrons' trajectories corresponding to six operative states, State 1-State 6, are shown in the figure and are summarized in the following Table:

| State | $V_{Gate}$ | $V_1$ | $V_2 = V_{out}$ | Left area | Right area |
|---|---|---|---|---|---|
| 1. | 0.2 | 0 | 0.2 | Transferring electrons to $A_2$ ($V_2$) | Circulating from $C_2$ to $A_2$ (from $V_2$ to $V_2$) |
| 2. | 0.2 | 0.1 | 0.1 | Keep transferring electrons to $A_2$ ($V_2$) | Keep circulating from $C_2$ to $A_2$ (from $V_2$ to $V_2$) |
| 3. | 0.2 | 0.2 | 0 | Transferring electrons to $A_2$ ($V_2$) stops | Keep circulating from $C_2$ to $A_2$ (from $V_2$ to $V_2$) |
| 4. | 0 | 0.2 | 0 | Circulating from $C_1$ to $A_1$ (from $V_1$ to $V_1$) | Transferring electrons to $A_1$ ($V_1$) |
| 5. | 0 | 0.1 | 0.1 | Keep circulating from $C_1$ to $A_1$ (from $V_1$ to $V_1$) | Keep transferring electrons to $A_1$ ($V_1$) |
| 6. | 0 | 0 | 0.2 | Keep circulating from $C_1$ to $A_1$ (from $V_1$ to $V_1$) | Transferring electrons to $A_1$ ($V_1$) stops |

Evidently, device 100 operates as a NOT gate.

It should be understood that additional electrodes may be incorporated into a device of the present invention in order, for example, to better focus the emitted electrons.

Figure 2D:
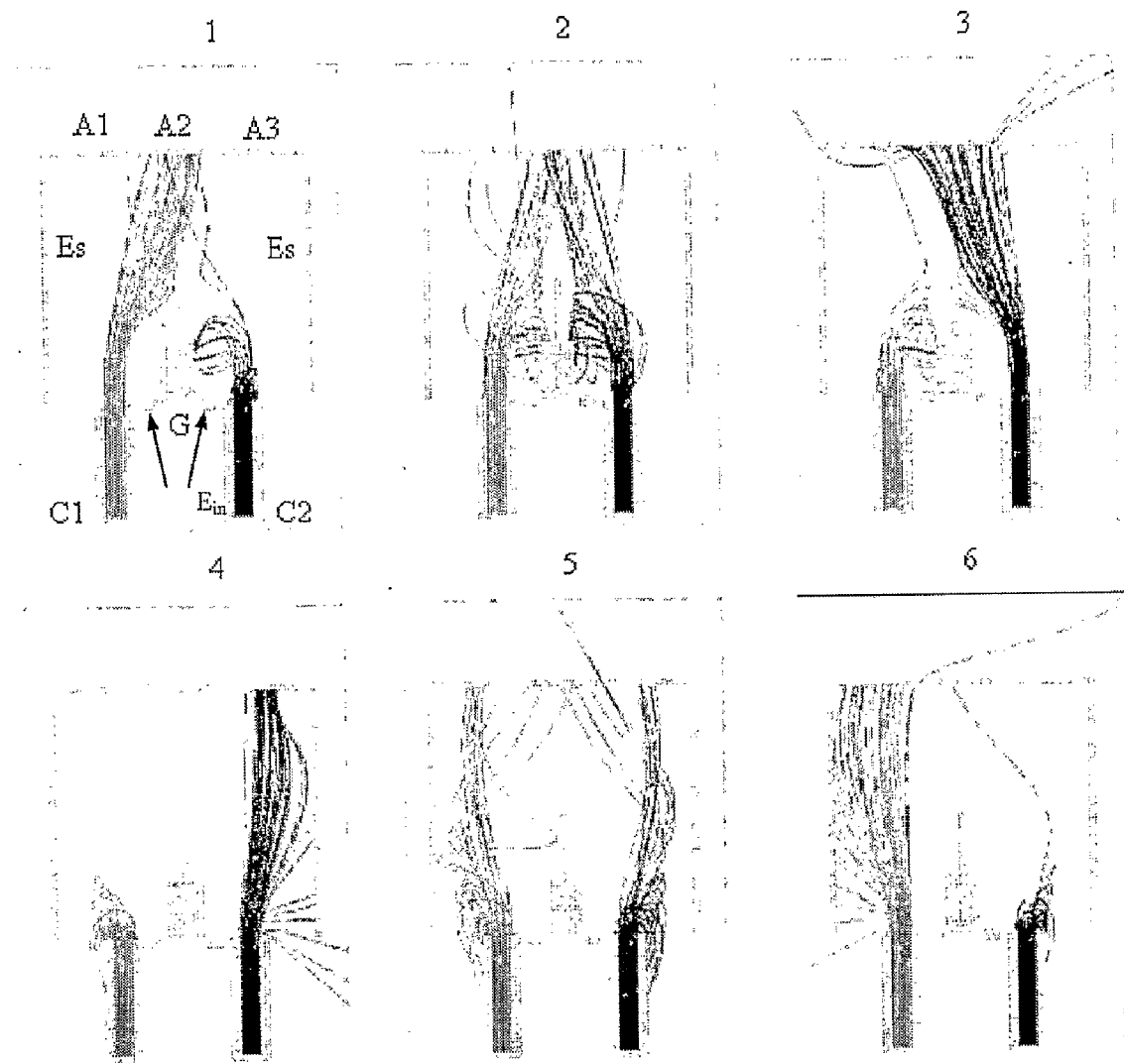
Figure 2E:
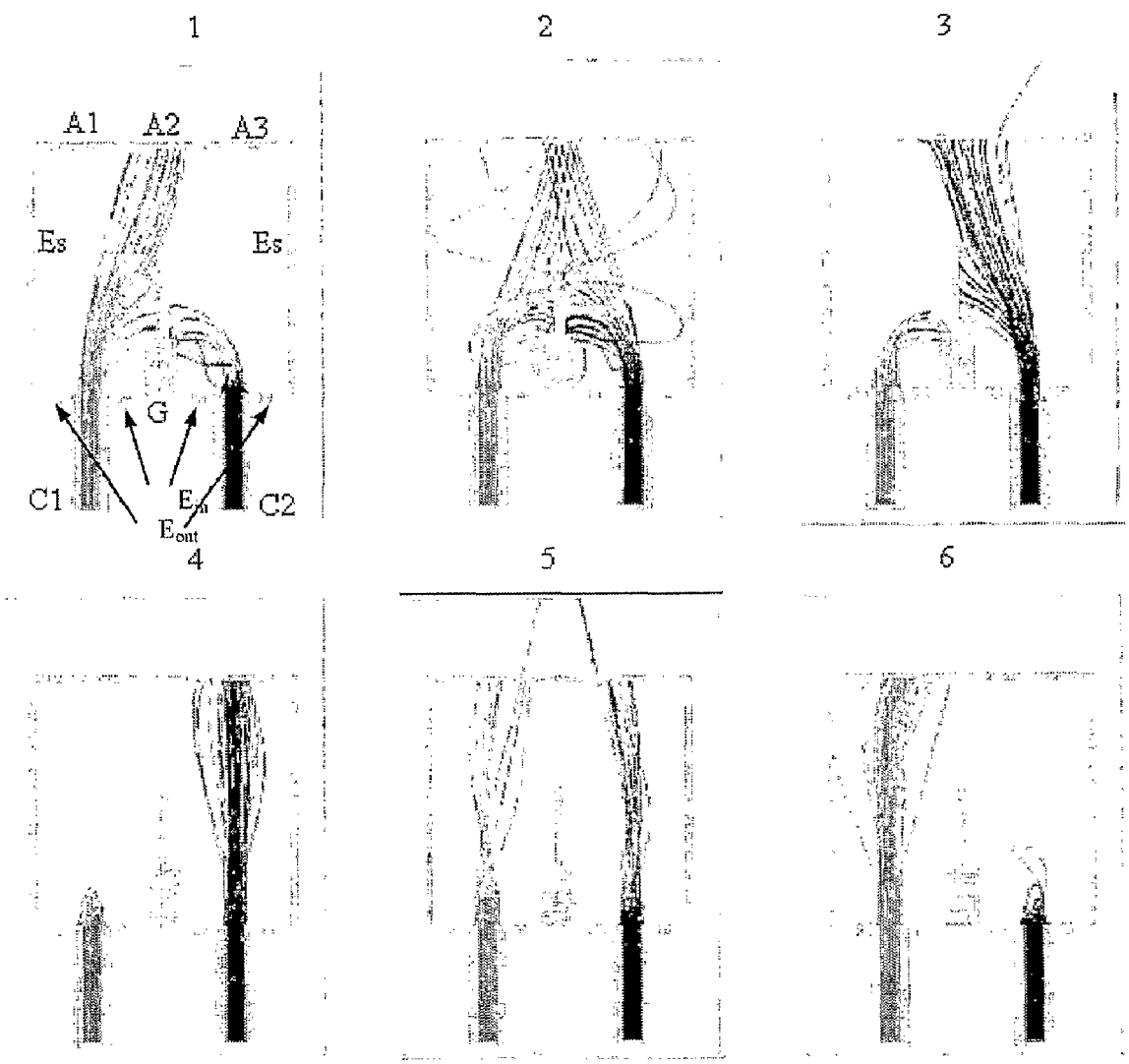

The same effects can be achieved by appropriately configuring and arranging the exiting electrodes. This is exemplified in FIGS. 2D and 2E showing detailed simulations, for the same six stages, of the operation of an inverter device similar to the above-described device 100 but with some structural modifications. As shown, here Cathodes $C_1$ and $C_2$ have elongated U-like shape.

The U-like shape of Cathodes $C_1$ and $C_2$ ensures a relatively narrow angle of electrons propagation once entering the vacuum cavity from the Cathodes, although these electrons are naturally emitted at all directions and have different values of initial kinetic energy. It should be noted that for this "focusing" effect to happen, it is preferred that only the bottom (horizontal plane) of each U-like shape electrode is coated with a photo-emissive material, while the side walls of the "U" serve only as a mechanical shielding of the electrons emitted with higher angles. The deeper the U shape compared to its width (diameter of its opening), the better the focusing. For example, such ratio may be about of 3:1-10:1.

In order to further focus the electron beam, additional electrodes, inner focusing electrodes $E_{in}$ (FIG. 2D), or also outer focusing electrodes $E_{out}$ (FIG. 2E) may be added just near the top opening of the U-shaped Cathode electrodes. Setting these additional electrodes $E_{in}$ and $E_{out}$ to LOW voltage will assist in "pushing" (deflecting) any electrons that leave the main beam direction to either side, back to the main beam direction. Even better results may be obtained if these additional electrodes $E_{in}$ and $E_{out}$ are kept floating. Any "lost" of electrons that will hit electrodes $E_{in}$ and $E_{out}$ will charge the electrodes to more and more negative potential, until it reaches a negative value equal to the maximum kinetic energy of the electrons in the system. The effect of the additional focusing electrodes can be easily seen from comparing FIG. 2D in which only inner focusing electrodes $E_{in}$ are introduced, and FIG. 2E in which outer electrodes $E_{out}$ are added.

In the above described examples, the proper functionality of device 100 is based on the assumption that the total number of electrons contained in both sets of floating electrodes does not degrade throughout the entire lifetime of the device. If this is not the case (leakage currents, etc.), the potentials of the floating electrodes may increase as a result, until finally no more electrons are able to escape from the Cathodes to vacuum.

Figure 3:
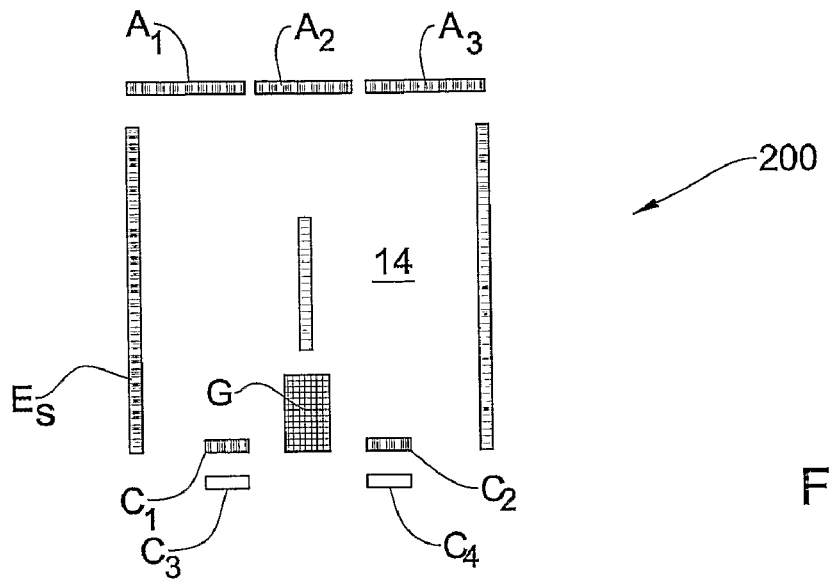
FIGS. 3 and 4 schematically illustrate two more examples, respectively, of an inverter device of the present invention.

The above problem can be solved by providing additional Cathodes in the device. This is exemplified in FIG. 3 showing a device 200 which, in addition to electrodes $C_1$, $C_2$, $A_1$-$A_3$ of the above-described device 100, includes a Cathode $C_3$ and a Cathode $C_4$, which in the present example are placed below Cathode $C_1$ and Cathode $C_2$, respectively. These additional Cathodes $C_3$ and $C_4$ are set to a potential equal to about $(V^{high}+E^{(max)}_k)$. Considering the parameters used in the above example, namely $(V^{(max)}_1=0.2V$ and $E^{(max)}_k=0.2$ eV), the Cathodes' potential is about 0.4 eV. This setting ensures that no electrons reach Cathodes $C_1$ and $C_2$ from Cathodes $C_3$ and $C_4$, unless the former become "too" positive (when their potential becomes higher than 0.2 eV). Additional Cathodes $C_3$ and $C_4$ therefore serve as a selective source of electrons, as well as a reference potential for the two sets of floating electrodes.

It should be understood that many other configurations enabling to compensate for the loss of electrons can be used. Also, only one additional cathode ($C_3$ or $C_4$) may be used separately (there is no need for using both of them simultaneously). Moreover, either one of Cathodes $C_3$ and $C_4$ or both of them may be located next to any one or more floating electrodes (e.g., above Anode $A_1$ or $A_2$ or $A_3$).

It should also be understood that the specific configurations described above are just examples, and other ways of appropriately placing the electrodes are possible, as long as the basic principles of the invention are kept (i.e., provision of floating electrode(s) which is(are) charged or discharged according to an input field, e.g. input voltage applied to one or more Gates, and initial potential condition of the source of free electrons—Cathode).

Figure 4:
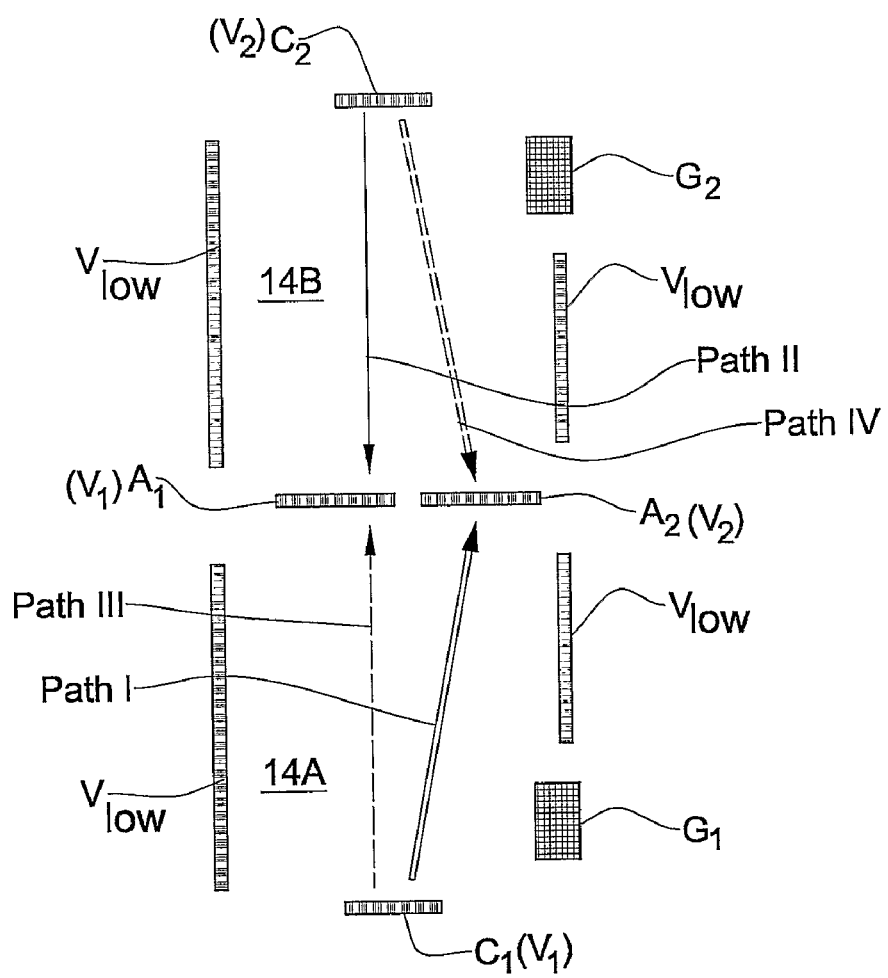

Referring to FIG. 4, there is schematically illustrated yet another example of the configuration of an inverter device of the present invention, which is equivalent in operation to the device of FIG. 2A. An inverter device 300 of FIG. 4 includes an input unit 12A formed by two electrodes (Gates) $G_1$ and $G_2$, and a floating electrode assembly 12B formed by first and second electrodes' sets. The first floating electrode set includes a Cathode $C_1$ and an Anode $A_1$ at the same potential $V_1$, and the second set includes a Cathode $C_2$ and an Anode $A_2$ at the same potential $V_2$. Here, Anodes $A_1$ and $A_2$ are arranged in a spaced-apart relationship in a plane (or two spaced-apart parallel planes) between the Cathodes $C_1$ and $C_2$ planes, the Gate electrode is doubled (Gates $G_1$ and $G_2$), and only one Anode in each set of floating electrodes is used. Although device 300 defines two cavities of electrons' propagation 14A and 14B, it actually presents the single basic unit as the device output can be read from either one of its floating electrodes (floating Anodes). It should be noted that the entire functionality description given above with respect to device 100 (FIGS. 2A-2E) suits the example of FIG. 4 as well, with the only difference in that the functionality of anode $A_3$ of device 100 is fulfilled by anode $A_1$ in device 300.

Figure 5A:
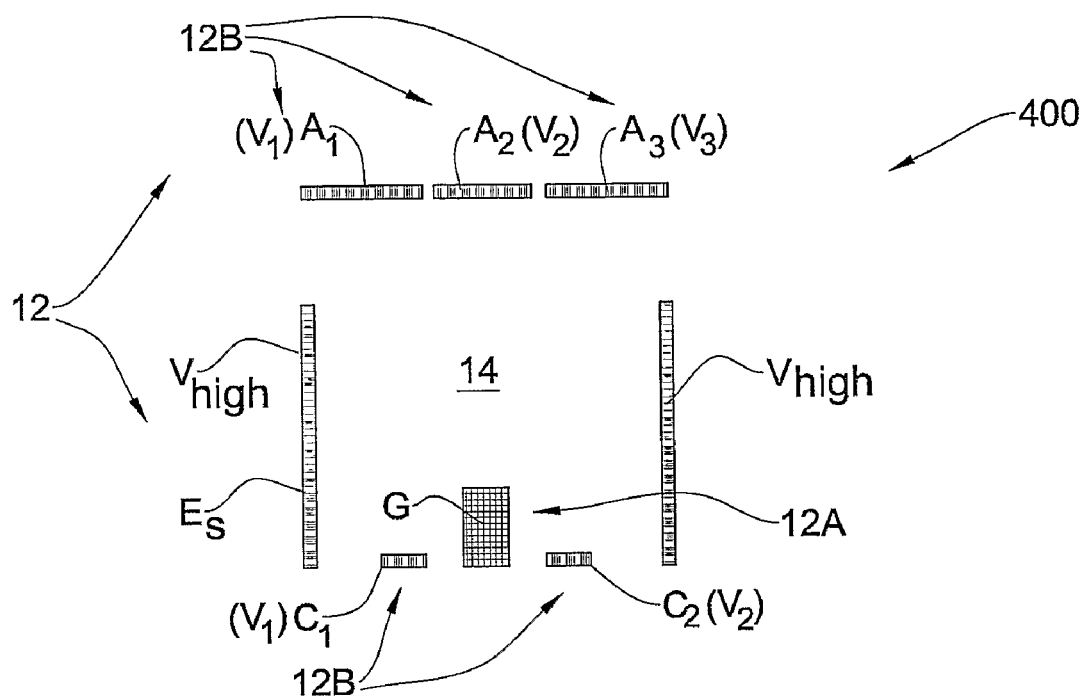
FIGS. 5A to 5C schematically illustrate yet another example of the device of the present invention operable as NOT gate.
Figure 5B:
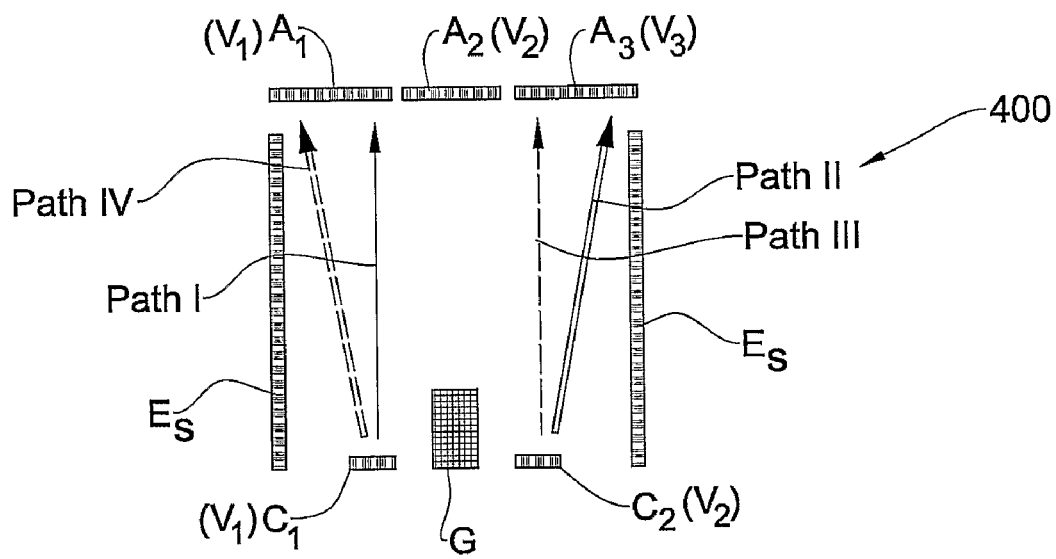
Figure 5C:
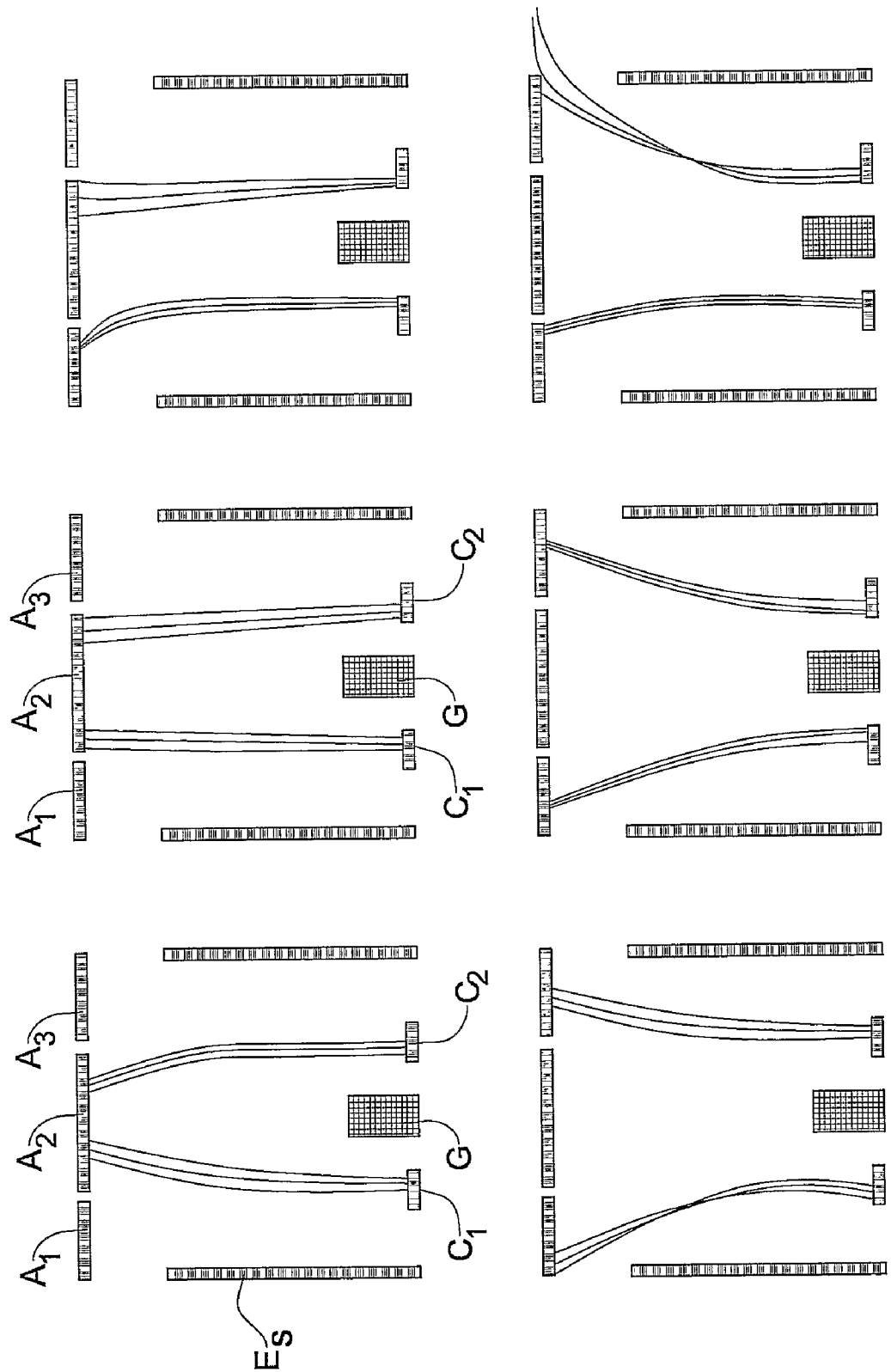

FIGS. 5A to 5C exemplify yet another device 400 configured to operate as an NOT gate. Device 400 is constructed generally similar to the above-described device 100 (see FIG. 2A), but distinguishes therefrom in that side electrodes $E_S$ are constantly connected to $V^{high}$ (instead of $V^{low}$ in device 100). FIG. 5B shows, in a self-explanatory manner, the electrons' trajectories. FIG. 5C shows detailed simulation, including intermediate states. The Table described above with reference to FIG. 2C can be referred to these states with no changes. It should be noted that device 400 can be slightly modified to operate as NAND gate, as will be described further below with reference to FIG. 7.

It should be noted, although not specifically shown, that it is generally possible to construct an inverter using a single floating Cathode (e.g. an illuminated photocathode), along with means for generating an external field suitably dependent on the input voltage. For example, the Cathode can be located between two other electrodes, a control Gate and an additional electrode (reference electrode). Input voltage is applied to the Gate and output voltage is read from the Cathode, and the additional electrode is maintained at a constant potential (e.g., ground). The output potential (i.e., of the Cathode) depends on the potentials of the other electrodes, on the capacitances between them, and on the excess charge (as a result of emission). This dependence can be utilized so that when LOW input is applied to the Gate, the output at the Cathode is HIGH as a result of emission from the Cathode, and when HIGH input is applied to the Gate, the output is LOW (e.g., no emission).

For example, when the input voltage to the Gate is sufficiently low so as not to result in an electric field that inhibits electron emission from the Cathode, then electrons are indeed emitted (e.g. towards the additional electrode). The emission causes the potential of the Cathode to rise. The raised potential inhibits emission, at least partly, and also decelerates the electrons already emitted. The potential of the additional electrode, the kinetic energy of emission, and the geometry of the device can be adjusted so that the emitted electrons are not collected (e.g. by the additional electrode), but lose their kinetic energy while traversing the distance between the electrodes (due to the raised potential between them) and return to the Cathode. Nevertheless, if the output is read while the emitted electrons are "in flight", then it will be relatively high. Thus "LOW" input can result in "HIGH" output without loss of charge, provided that output is read in the appropriate time interval.

It should be understood that generally in case of a Photocathode, an input signal (i.e., that corresponding to a certain Boolean value) may be constituted by a light signal on the Photocathode, while a certain voltage is maintained on the Gate. Preferably however the Photocathode is maintained under certain substantially constant illumination and the input signal is constituted by the potential on Gate (active or floating).

Figure 6:
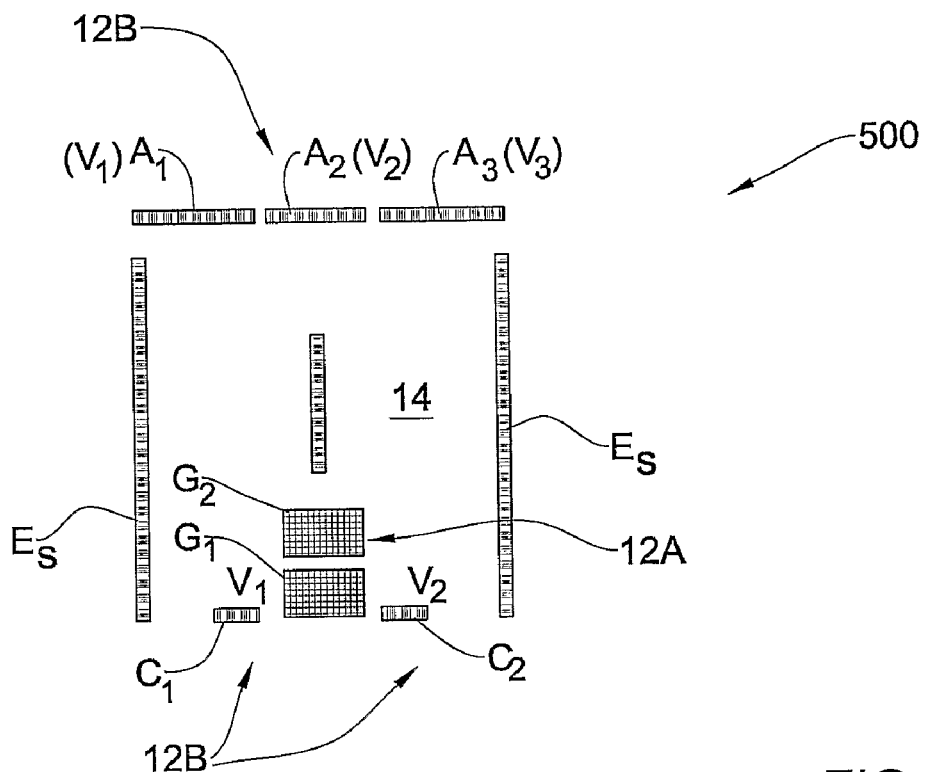
FIG. 6 is a schematic illustration of an example of the device of the present invention configured and operable as NOR gate.

Reference is made to FIG. 6 exemplifying a device 500 configured to operate as NOR gate. Device 500 is constructed similarly to the above-described device 100, namely, includes two sets of electrically floating electrodes, the first set including a Cathode $C_1$ and Anodes $A_1$ and $A_3$, and the second set including a Cathode $C_2$ and an Anode $A_2$, and includes side electrodes kept at LOW voltage; and distinguishes from the above-described device 100 in that it has an input electrode unit 12A formed by two Gates $G_1$ and $G_2$. These two Gates are accommodated in a spaced-apart relationship along a cavity 14 (i.e. one on top of the other, separated by vacuum or insulator material). When both Gates $G_1$ and $G_2$ are in their HIGH ($V^{high}$) or LOW ($V^{low}$) state (Boolean value "1" or "0"), device 500 functions as an inverter. When one of the gates $G_1$ and $G_2$ is in HIGH state ($V^{high}$) and the other is in LOW state ($V^{low}$), device 500 operates similar to the case where both Gates are at $V^{high}$. The output voltage ($V_{out}=V_2$) is therefore $V^{high}$ only when both Gates are at $V^{low}$. This matches the conditions of NOR operator.

It should be understood that the input electrode assembly could be formed by more than two Gates, thus resulting in the implementation of a multiple NOR operator. This might require some electrostatics fine tuning, like changing the size and possibly also the location of some of the electrodes.

It should also be understood that device 500 may be operable as an OR gate. To this end, output voltage, $V_{out}$, is read at the first floating electrode set, i.e. at either one of Anodes $A_1$ and $A_3$ (i.e., $V_{out}=V_1$).

Figure 7:
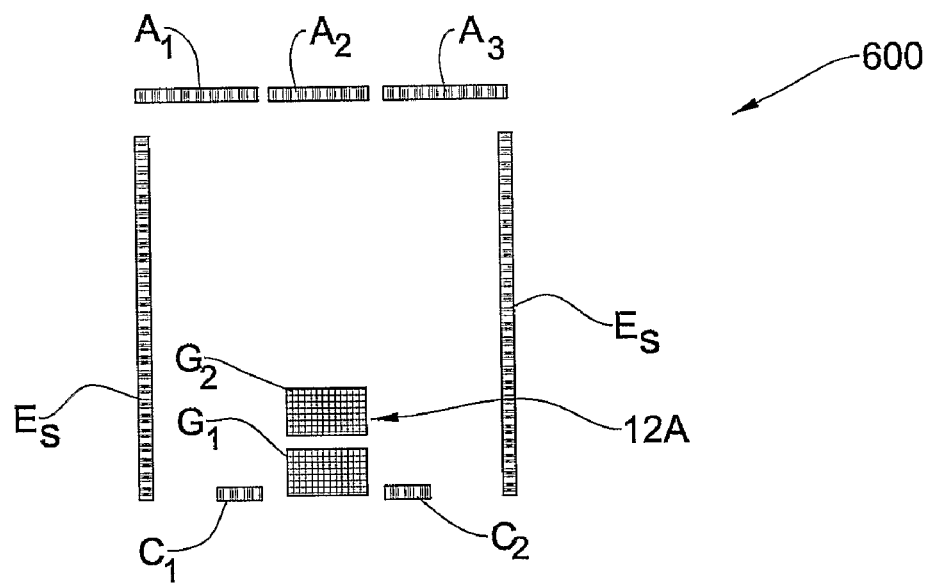
FIG. 7 is a schematic illustration of an example of the device of the present invention configured and operable as NAND gate.

As indicated above, device 400 described with reference to FIGS. 5A-5C can be slightly modified to operate as NAND gate. This is illustrated in FIG. 7, showing a NAND gate device 600 configured generally similar to device 400 but having an input electrode assembly formed by two Gates $G_1$ and $G_2$, one on top of the other (similar to device 500), and side electrodes $E_S$ at HIGH voltage. When both Gate units $G_1$ and $G_2$ are in their $V^{high}$ or $V^{low}$ state (corresponding to "1" or "0"), the device functions as an inverter. When the Gates $G_1$ and $G_2$ have different states corresponding to different Boolean values (i.e., one of the Gates $G_1$ and $G_2$ is at $V^{high}$ and the other is at $V^{low}$), device 600 operates similar to the case where both Gate units are at $V^{low}$; the output voltage is therefore $V_{out}=V^{low}$ only when both Gates are at $V^{high}$; this matches the NAND operator. Similarly, the input electrode assembly can be formed by more than two Gates, and thus a multiple NAND is implemented (although this may require some electrostatic fine tuning).

An AND gate can also be obtained from the above-described configuration of FIG. 7 by reading the output voltage from the first set of floating electrodes rather than the second set (i.e., $V_{out}=V_1$).

Figure 8A:
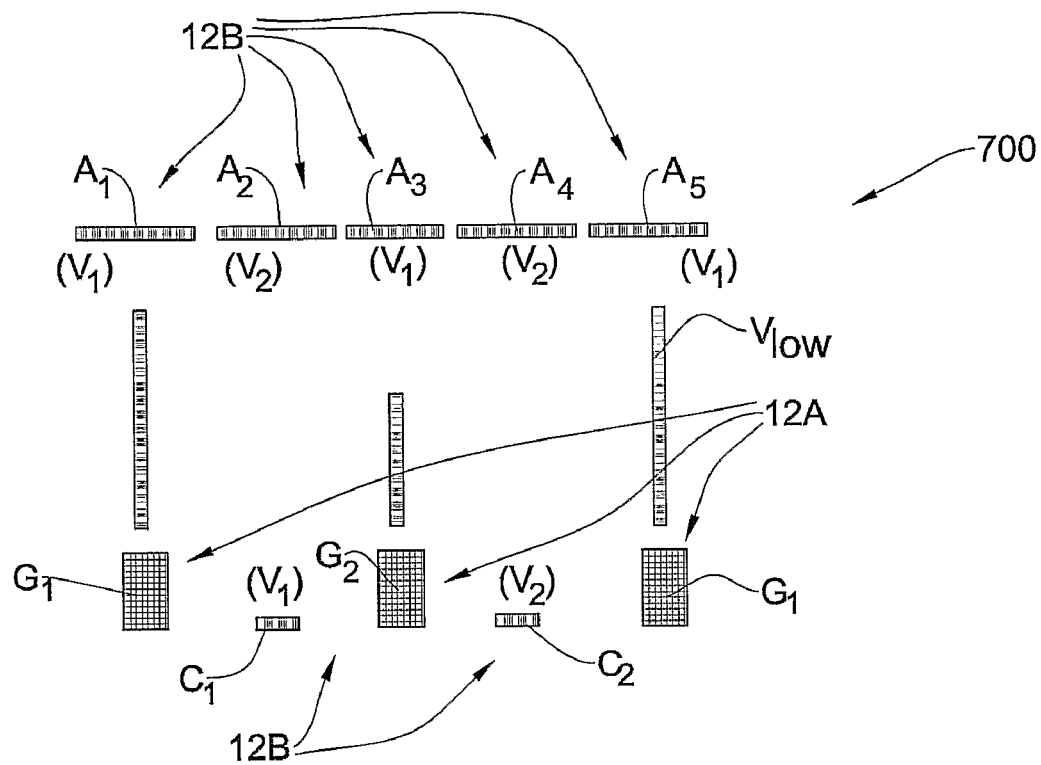
FIGS. 8A and 8B exemplify a device of the present invention configured and operable as a XOR gate.
Figure 8B:
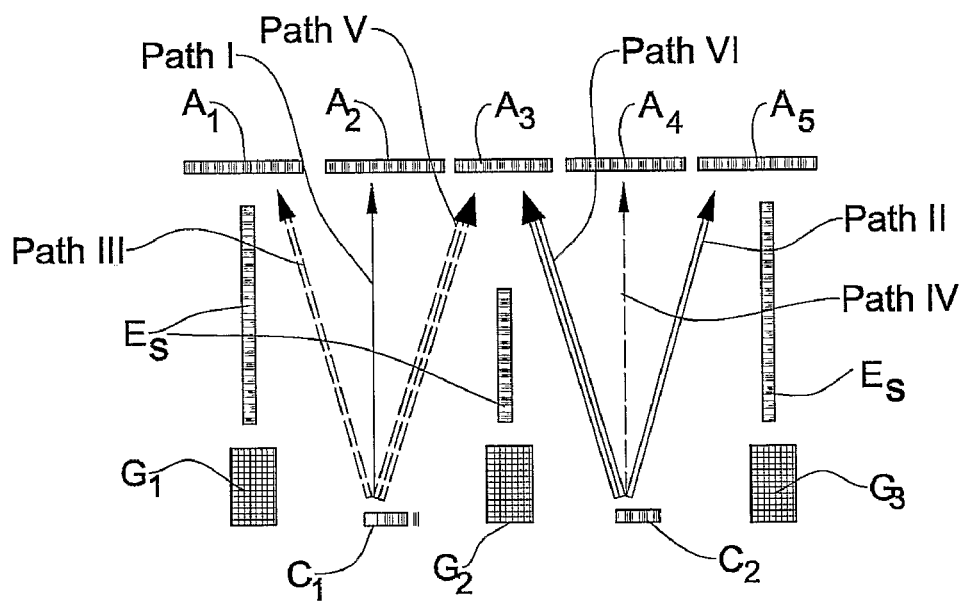

Reference is made to FIGS. 8A-8B exemplifying a device 700 configured and operable as a XOR gate. As shown in FIG. 8A, device 700 includes an input electrode unit 12A formed by two Gate electrodes $G_1$ and $G_2$; and a floating electrode assembly 12B formed by first and second sets of floating electrodes. The first set includes a Cathode $C_1$, an Anode $A_1$, an Anode $A_3$ and an Anode $A_5$ (all at potential $V_1$), and the second set includes a Cathode $C_2$, an Anode $A_2$ and an Anode $A_4$ (all at potential $V_2$). Side electrodes $E_S$ are preferably provided that are kept at potential $V^{low}$.

When both Gates $G_1$ and $G_2$ are at $V^{high}$ or $V^{low}$, electrons ejected from both Cathodes $C_1$ and $C_2$ are not shifted sideways and go toward Anode $A_2$ and Anode $A_4$, respectively (paths I and IV in FIG. 8B). This charges the floating electrodes in the second set with electrons, and therefore $V_2$ becomes equal to $V^{low}$, and $V_1$—equal to $V^{high}$. The output voltage $V_{out}$ is $V_2$ and therefore $V_{low}$. When Gate $G_1$ is at $V^{high}$ and Gate $G_2$ is at $V^{low}$, electrons take paths II and III, and $V_2$ becomes $V^{high}$ while $V_1$ becomes $V^{low}$. When Gate $G_1$ is at $V^{low}$ and Gate $G_2$ is at $V^{high}$, electrons take paths V and VI. Again, $V_2$ becomes $V^{high}$, while $V_1$ becomes $V^{low}$. Hence, when the Gates are at different states (different Boolean values), $V_{out}$ is $V^{high}$.

It should be understood that a XNOR gate can be implemented by using the XOR-device configuration of FIG. 8A, but reading output voltage $V_{out}$ from $V_1$ electrode instead of $V_2$ electrode.

It will be appreciated by persons skilled in the art that various logic gate devices can be implemented by connecting the above-described devices together in order to create a complex Boolean operation. The output voltage of one device is fed as the input signal (Gate voltage) of the successive device, and so on. It should also be noted that the operation of the entire logic complex of functions does not require electrical current flowing through the device.

Figure 9:
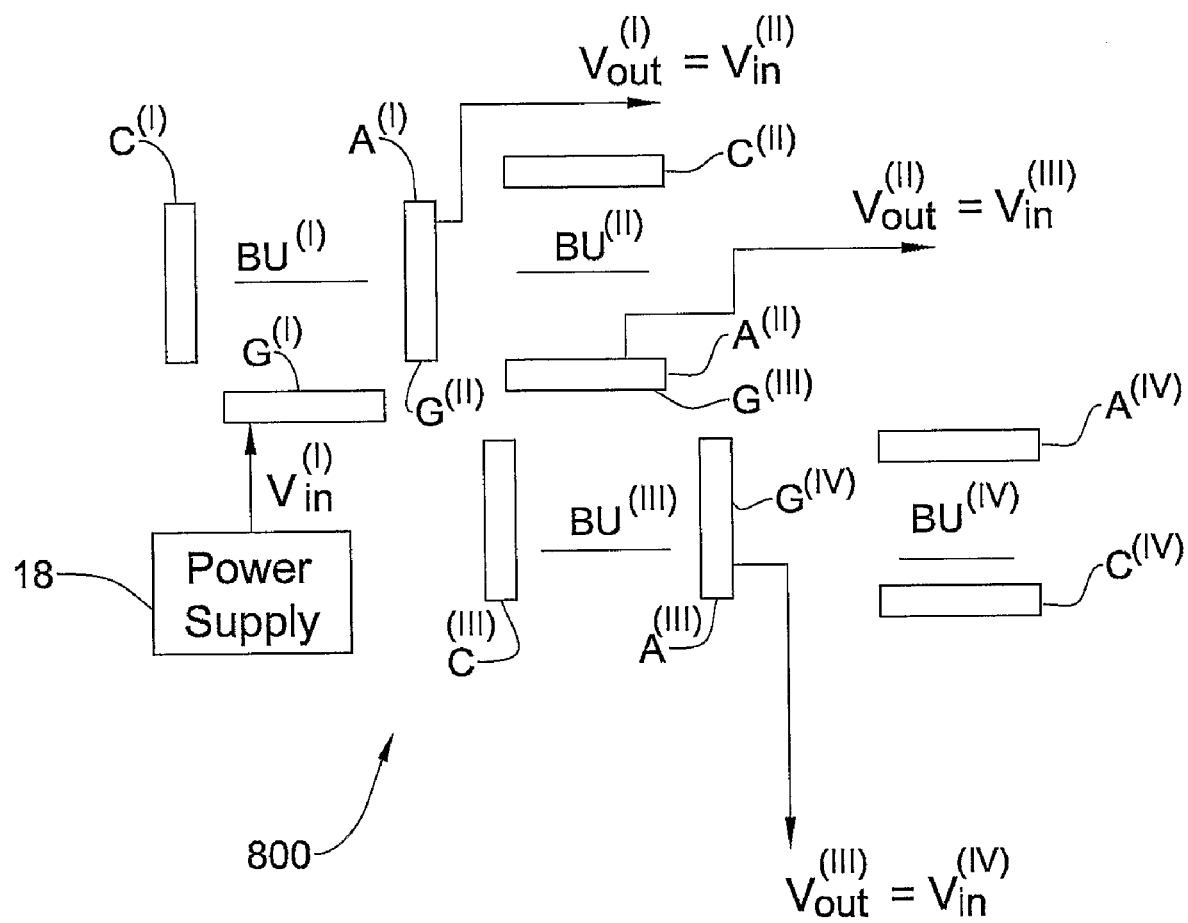
FIG. 9 exemplifies a device of the present invention formed by an array of basic units of FIG. 1 electrically connected to each other.

Such a multiple-unit electronic device is schematically illustrated in FIG. 9. Device 800 is formed by an array of basic units, four such basic units $BU^{(I)}$-$BU^{(IV)}$ being shown in the figure. Here, for simplicity of illustration only, each basic unit is shown as being formed by Cathode, Anode and Gate, but it should be understood that the basic units need not be identical, the basic unit may include more than one Cathode as well as more than one Anode, and that at least some of Cathode(s) and Anodes(s) may be constituted by the same electrode(s) or by different regions of the same electrode(s). Cathode/Anode electrodes constitute floating electrode assemblies 12B of the basic units. As for the input electrode assemblies, in the first basic unit $BU^{(I)}$ it includes one or more input electrodes including an active-electrode Gate $G^{(I)}$ to which an input signal $V^{(I)}_{in}$ is supplied from a power supply unit 18, while the input electrode of each of the successive basic units $BU^{(II)}$-$BU^{(IV)}$ is constituted by the floating Anode of the preceding basic unit. More specifically, Anode $A^{(I)}$ of basic unit $BU^{(I)}$, from which output $V^{(I)}_{out}$ is read, serves as Gate $G^{(II)}$ of basic unit $BU^{(II)}$; Anode $A^{(II)}$ of basic unit $BU^{(II)}$, from which output $V^{(II)}_{out}$ is read, serves as Gate $G^{(III)}$ of basic unit $BU^{(III)}$; Anode $A^{(III)}$ of basic unit $BU^{(III)}$, from which output $V^{(III)}_{out}$ is read, serves as Gate $G^{(IV)}$ of basic unit $BU^{(IV)}$; and so on.

In order to make the operation of the devices of the present invention more robust (from electrostatics related point of view), additional elements may be introduced that improve the characteristics of the electron beam manipulated in the device; for example, by adding focusing electrodes between the Cathodes plane and the Gate plane, by modifying the energy (mean value and/or distribution) of the electrons (e.g., using additional electrodes to provide a potential barrier and/or acceleration means), etc. Various means known in the art of electron optics may be used, and may be applicable also to miniature, simply designed electrodes.

The device of the present invention can be manufactured as an integrated structure using the principles of lithography. The preferred implementation of the above devices is in the micron and sub-micron scale, using current semiconductor technologies and nano-technology. Miniaturizing the devices allows for high switching frequencies.

The implementations of NAND/AND (FIG. 7) and NOR/OR (FIG. 6) disclosed herein are almost identical in structure, the main difference being the reference voltage applied to the side electrodes $E_S$ ($V^{low}$ in the case of NOR/OR and $V^{high}$ in the case of NAND/AND). Hence, with some electrostatic fine tuning, exactly the same geometrical configuration can be used to implement both such logic gates, with the functionality being set by the voltage supply to the side electrodes. Because the latter can be altered without disturbing the structure of the device, real time control of the device's functionality is possible. Furthermore, as the voltages applied to the side electrodes are themselves either $V^{low}$ or $V^{high}$, the function carried out by the device can itself be set according to the result of some Boolean operation.

Thus, using logic devices according to the present invention, it is possible for several different operations or calculations to be carried out with the same hardware.

Those skilled in the art will readily appreciate that various modifications and changes can applied to the embodiments of the invention as hereinbefore described without departing from the scope of the invention as defined in and by the appended claims. Various geometries can be used in order to implement a device of the invention that creates an output which is any logical function of the device inputs (e.g. AND, XOR etc.), using free electrons, and at least one source of electrons with initial kinetic energy, and in which at least one electrode is charged or discharged. The device may be used as resonator, where the radiation generation is controlled by the electrons' trajectory through the device.

The invention claimed is:

1. An electronic device comprising an electrodes arrangement of one or more basic units, the basic unit being configured to define at least one vacuum space for free charged particles' propagation and comprising an input assembly for supplying one or more input signals, and a floating electrode assembly accommodated proximal said input assembly and serving for reading an output signal therefrom, the floating electrode assembly comprising at least one source electrode of the free charged particles and at least one target electrode for receiving the charged particles that are directed thereto from the source electrode, the at least one target electrode being a floating electrode and being chargeable and dischargeable in response to the input signal thereby creating the output of the basic unit.

2. The device of claim 1, wherein the basic unit comprises one or more additional electrodes maintained at a certain constant potential during the device operation.

3. The device of claim 2, wherein said one or more additional electrodes extend along said at least one cavity aside thereof.

4. The device of claim 1, wherein the input assembly comprises one or more input electrodes, at least one of the input electrodes being an active electrode connectable to a power supply unit or grounded.

5. The device of claim 1, wherein the input assembly comprises one or more input electrodes, at least one of the input electrodes being a floating electrode.

6. The device of claim 5, comprising at least first and second basic units configured such that at least one of the floating electrodes of the first unit serves as said at least one floating input electrode of the second basic unit.

7. The device of claim 6, wherein said at least one floating electrode of the first unit is the floating electrode from which the first unit output is read.

8. The device of claim 1, comprising the single basic unit, the device being operable as a logic element for implementing at least one logic function.

9. The device of claim 1, wherein the floating electrode assembly of the basic unit comprises at least one electrically floating Cathode serving as said source of free electrons constituting the charged particles and said target for the electrons emitted thereby.

10. The device of claim 9, configured and operable as an inverter, charge being transported to or from said floating Cathode according to the input signal, such that when the input signal, corresponding to one of Boolean values, is high to cause the free electrons flow from the Cathode, the output voltage read from the Cathode is low corresponding to a different Boolean value, and vice versa.

11. The device of claim 1, wherein the floating electrode assembly of the basic unit comprises a predetermined number of sets of floating electrodes, the floating electrode set comprising at least one electrically floating Cathode serving as said source of free electrons constituting the charged particles and at least one electrically floating Anode serving as said target, the Cathode and Anode of the same set of floating electrodes being at the same electric potential.

12. The device of claim 11, wherein the Cathode and Anode of the same set of the floating electrodes are electrically connected to one another.

13. The device of claim 11, wherein the Cathode and Anode of the same set of the floating electrodes are constituted by spaced-apart regions of the same curved electrode.

14. The device of claim 11, wherein the floating electrode assembly of the basic unit comprises at least the first and second sets of electrically floating electrodes, configured and operable to implement the electrons movement and thus transfer of charge between said at least first and second sets depending on potential difference between the different floating electrode sets.

15. The device of claim 14, wherein the electrodes are arranged to define electrons movement paths from the at least one Cathode to the at least one Anode of the same set, and from the at least one Cathode of one set to the at least one Anode of the other set.

16. The device of claim 14, wherein the floating electrode assembly comprises at least first and second Cathodes, an array of at least two Anodes spaced from the Cathodes, the input electrode assembly comprising at least one Gate electrode.

17. The device of claim 16, wherein the basic unit comprises one or more additional electrodes including at least two electrodes located in a spaced-apart relationship aside the at least one cavity defined by a space between the Cathodes and the Anodes.

18. The device of claim 17, wherein the additional electrodes are kept at a certain relatively low potential so as not to attract electrons from the Cathode.

19. The device of claim 17, wherein the additional electrodes are kept at a certain low or high potential so as to, respectively, not to attract and attract electrons from the Cathode.

20. The device of claim 18, configured and operable to provide, at the relatively high input voltage on the Gate electrode corresponding to one Boolean value, transfer of a negative charge from one set of the floating electrodes to the other resulting in the low output voltage read from the second set, and, at the relatively low input voltage on the Gate corresponding to a different Boolean value, a negative charge transfer back to the first set of floating electrodes resulting in the high output voltage read from the second set.

21. The device of claim 20, wherein the first set of floating electrodes is formed by the first Cathode and the first and third Anode electrodes at the same potential $V_1$, and the second set of floating electrodes is formed by the second Cathode and the second Anode at the same potential $V_2$ different from $V_1$.

22. The device of claim 21, wherein the floating electrodes are arranged such as to define four possible paths for the electrons movement through the cavity, the first path corresponding to the electrons' transfer from the first floating electrode set to the second set of floating electrode while moving from the first Cathode to the second Anode, the second path corresponding to the electrons' transfer from the second set back to the first set while being transferred from the second Cathode to the third Anode, the third path corresponding to the electrons circulation within the first set while moving from the first Cathode to the first Anode, and the fourth path corresponding to the electrons circulation within the second set while moving from the second Cathode to the second Anode.

23. The device of claim 22, configured to selectively cause the electrons propagation along one or more of said four paths depending on the input at said at least one Gate, such that when the Gate voltage is relatively high, the negative charge is transferred from the first set to the second set of floating electrodes thus raising the potential of the first set relative to the second set, and when the Gate voltage is low, the negative charge is transferred back to the first set of floating electrodes.

24. The device of claim 23, wherein the second set of floating electrodes serves for reading the device output voltage therefrom.

25. The device of claim 23 wherein the basic unit comprises at least two additional floating Cathodes accommodated proximal to said first and second Cathodes and having a predetermined electric potential of a value preventing the electrons emitted by the additional Cathodes to reach the first and second Cathodes, said additional Cathodes serving as a selective source of electrons, and as a reference potential for the two sets of floating electrodes.

26. The device of claim 21, being adapted to operate as an inverter.

27. The device of claim 18, wherein the input assembly comprises two or more Gates accommodated in a spaced-apart electrically-insulated relationship along the cavity.

28. The device of claim 27, configured and operable as one- or multiple-operator NOR gate, depending on a number of said Gates.

29. The device of claim 27, configured and operable as an OR gate.

30. The device of claim 27, configured and operable as an AND gate.

31. The device of claim 15, wherein each of the first and second sets of floating electrodes comprises one Cathode and one Anode, the Cathode and Anode of each set being at the same potential different from that of the other set, the Anodes being accommodated in a spaced-apart relationship in a plane or planes between the Cathode planes, thereby defining two cavities of the electrons propagation from the first Cathode to the Anodes and from the second Cathode to said Anodes.

32. The device of claim 31, wherein the input assembly comprises two Gates accommodated, respectively, in between the first Cathode and the Anodes planes, and the second Cathode and the Anodes' planes.

33. The device of claim 15, wherein the floating electrode assembly comprises first and second Cathodes of the first and second sets, respectively, and five Anodes including three Anodes of the first set arranged in an alternating relationship with the two Anodes of the second set, and the input assembly comprises a Gate accommodated between the first and second Cathodes.

34. The device of claim 33, configured and operable as an XOR gate.

35. The device of claim 1, wherein the at least one of the electrically floating source electrode is a Photocathode, the device being configured to expose said at least one Photocathode to illumination.

36. The device of claim 35, comprising an illumination source configured and operable to provide said illumination to the Photocathode.

37. The device of claim 1, comprising a control system configured and operable to receive and analyze the electrical output read from at least one of the floating electrodes.

38. The device of claim 37, wherein the control system is configured and operable to selectively read the electrical output from one of the floating electrodes.

39. The device of claim 37, wherein the control system is configured and operable to control illumination of the floating Photocathode being said source of the charged particles.

40. The device of claim 38, wherein the control system is configured and operable to control the input signal.

41. An electronic device configured and operable as logic NOT gate, the device comprising an electrode arrangement configured to define at least one vacuum space for free charged particles' propagation, the electrode arrangement comprising at least one control electrode for supplying input signals thereto, and a floating electrode assembly comprising at least one source electrode of the free charged particles and at least one target electrode for receiving the charged particles directed thereto from the source electrode, at least one target electrode being a floating electrode and being chargeable and dischargeable in response to the input signal thereby creating the output of the basic unit, the device being operable by a transport of charge to or from the at least one floating electrode according to the input voltage applied to said at least one control electrode, such that when the input voltage is high corresponding to one of the Boolean values thus attracting the charged particles from the floating source, the output voltage read at the floating electrode assembly becomes low corresponding to the other Boolean value, and vice versa.

42. An electronic device configured and operable as at least one logic gate, the device comprising a basic unit configured to define at least one vacuum space for free charged particles' propagation and comprising an input assembly for supplying an input signal corresponding to a certain Boolean value, a floating electrode assembly accommodated proximal said input assembly and serving for reading an output signal therefrom, and at least one reference electrode maintained at a certain constant voltage during the device operation, the floating electrode assembly comprising at least one source electrode of the free charged particles and at least one target electrode for receiving the charged particles directed thereto from the source electrode, the at least one target electrode being floating and being chargeable and dischargeable in response to the input signal thereby creating the output of the basic unit.

43. An electronic device configured and operable as at least one logic gate, the device comprising a basic unit configured to define at least one vacuum space for free charged particles' propagation and comprising an input assembly for supplying an input signal corresponding to a certain Boolean value, a floating electrode assembly accommodated proximal said input assembly and serving for reading an output signal therefrom, and at least one reference electrode maintained at a certain constant voltage during the device operation, the floating electrode assembly being configured to define at least two sets of floating electrodes, each floating set having a certain electric potential different from that of the other floating set and including at least one source of the free charged particles and at least one target toward which the charged particles are directed, the variation of the input signal causing transfer of charge between the electrodes of the same floating set and from one floating said to the other, resulting in selective charging and discharging of the floating set thereby creating the output of the basic unit.

44. A method for use in implementing various logic functions, the method comprising controllably applying an input field to a floating electrode assembly, comprising at least one floating source electrode of charged particles and at least one floating target electrode for receiving charged particles directed thereto from the source electrode, to thereby affect the free charged particles' propagation in vacuum from the floating source of charged particles to the floating target, and controlling the read out of an electric potential on a selective one of the floating electrodes, the selectively read output being indicative of the selected logic function.

45. A method for use in implementing various logic functions, the methods comprising: providing an electrodes arrangement formed by an input electrode assembly and a floating electrode assembly comprising at least one floating source of free charged particles propagating through vacuum and at least one floating target electrode for receiving the charged particles propagating thereto from the source electrode; controlling an electrical input signal to at least one active electrode of the input electrode assembly thereby causing charging or discharging of the at least one floating electrode in response to the input signal; and selectively reading a potential on at least one of the floating electrodes, the selectively read output being indicative of the selected logic function.

46. An electronic device comprising an electrodes arrangement of at least first and second basic units, the basic unit being configured to define at least one vacuum space for free charged particles' propagation and comprising: an input assembly comprising one or more input electrodes for supplying an input signal, at least one of the input electrodes being a floating electrode; and a floating electrode assembly accommodated proximal said input assembly and serving for reading an output signal therefrom, the floating electrode assembly being configured to define at least one source of the free charged particles and at least one target toward which the charged particles are directed and is chargeable and dischargeable in response to the input signal thereby creating the output of the basic unit, at least one of the floating electrodes of the first basic unit serving as said at least one floating input electrode of the second basic unit, and at least one floating electrode of the first basic unit being the floating electrode from which the first unit output is read.

47. An electronic device comprising an electrodes arrangement of one or more basic units, the basic unit being configured to define at least one vacuum space for free charged particles' propagation and comprising an input assembly for supplying an input signal, and a floating electrode assembly accommodated proximal said input assembly and serving for reading an output signal therefrom, the floating electrode assembly comprising at least one electrically floating Cathode serving as at least one source of free electrons constituting the charged particles and at least one target toward which the charged particles are directed and is chargeable and dischargeable in response to the input signal thereby creating the output of the basic unit.

48. An electronic device comprising an electrodes arrangement of one or more basic units, the basic unit being configured to define at least one vacuum space for free charged particles' propagation and comprising an input assembly for supplying an input signal, and a floating electrode assembly accommodated proximal said input assembly and serving for reading an output signal therefrom, the floating electrode assembly being configured to define at least one source of the free charged particles and at least one target toward which the charged particles are directed and is chargeable and dischargeable in response to the input signal thereby creating the output of the basic unit, the floating electrode assembly of the basic unit comprising a predetermined number of sets of floating electrodes, the floating electrode set comprising at least one electrically floating Cathode serving as said source of free electrons constituting the charged particles and at least one electrically floating Anode serving as said target, the Cathode and Anode of the same set of floating electrodes being at the same electric potential.

49. An electronic device comprising an electrodes arrangement of one or more basic units, the basic unit being configured to define at least one vacuum space for free charged particles' propagation and comprising an input assembly for supplying an input signal, and a floating electrode assembly accommodated proximal said input assembly and serving for reading an output signal therefrom, the floating electrode assembly being configured to define at least one source of the free charged particles and at least one target toward which the charged particles are directed and is chargeable and dischargeable in response to the input signal thereby creating the output of the basic unit, the at least one of the electrically floating source electrodes being a Photocathode, the device being configured to expose said at least one Photocathode to illumination.

50. An electronic device comprising:
an electrodes arrangement of one or more basic units, the basic unit being configured to define at least one vacuum space for free charged particles' propagation and comprising an input assembly for supplying an input signal, and a floating electrode assembly accommodated proximal said input assembly and serving for reading an output signal therefrom, the floating electrode assembly being configured to define at least one source of the free charged particles and at least one target toward which the charged particles are directed and is chargeable and dischargeable in response to the input signal thereby creating the output of the basic unit; and
a control system configured and operable to receive and analyze the electrical output read from at least one of the floating electrodes, and for controlling illumination of a floating Photocathode being said source of the charged particles.

* * * * *